(12) United States Patent
Sasaki et al.

(10) Patent No.: US 7,871,853 B2
(45) Date of Patent: Jan. 18, 2011

(54) PLASMA DOPING METHOD AND APPARATUS EMPLOYED IN THE SAME

(75) Inventors: Yuichiro Sasaki, Tokyo (JP); Katsumi Okashita, Osaka (JP); Hiroyuki Ito, Chiba (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 276 days.

(21) Appl. No.: 11/887,456

(22) PCT Filed: Mar. 28, 2006

(86) PCT No.: PCT/JP2006/306290

§ 371 (c)(1),
(2), (4) Date: Feb. 17, 2009

(87) PCT Pub. No.: WO2006/104145

PCT Pub. Date: Oct. 5, 2006

(65) Prior Publication Data

US 2009/0186426 A1    Jul. 23, 2009

(30) Foreign Application Priority Data

Mar. 28, 2005 (JP) .......................... P. 2005-092543

(51) Int. Cl.
*H01L 21/00* (2006.01)
(52) U.S. Cl. .................. 438/96; 438/482; 438/E21.564
(58) Field of Classification Search ............ 438/96, 438/482, 433–437, 224–247
See application file for complete search history.

(56) References Cited

U.S. PATENT DOCUMENTS

| | | | |
|---|---|---|---|
| 6,128,084 A | 10/2000 | Nanbu et al. | |
| 2001/0016376 A1* | 8/2001 | Yamazaki et al. | 438/156 |
| 2002/0037609 A1* | 3/2002 | Zhang et al. | 438/162 |
| 2005/0287776 A1 | 12/2005 | Sasaki et al. | |

FOREIGN PATENT DOCUMENTS

| | | |
|---|---|---|
| JP | 1-129413 | 5/1989 |
| JP | 2-68925 | 3/1990 |
| JP | 11-330185 | 11/1999 |
| JP | 2000-054150 | 2/2000 |
| JP | 2001-196307 | 7/2001 |
| JP | 2004-179592 | 6/2004 |
| JP | 2005-005328 | 1/2005 |
| WO | WO 98/57146 | 12/1998 |

OTHER PUBLICATIONS

Sasaki, Y., et al., "$B_2H_6$ Plasma Doping with In-situ He Pre-amorphization", UJT Confidential, Symposia on VLSI Technology and Circuits, 2004 , Japan.
Higaki, R., et al., "Effects of gas phase absorption into Si substrates on plasma doping process", European Solid State Device Research Conf, 2003.

* cited by examiner

*Primary Examiner*—Dung A. Le
(74) *Attorney, Agent, or Firm*—McDermott Will & Emery LLP

(57) ABSTRACT

A plasma doping method and a plasma doping apparatus, having a superior in-plane uniformity of an amorphous layer formed on a sample surface, are provided.

In the plasma doping method by which plasma is generated within a vacuum chamber, and impurity ions contained in the plasma are caused to collide with the surface of the sample so as to quality-change the surface of the sample into an amorphous state thereof, a plasma irradiation time is adjusted in order to improve an in-plane uniformity. If the plasma irradiation time becomes excessively short, then a fluctuation of the plasma is transferred to depths of an amorphous layer formed on a silicon substrate, so that the in-plane uniformity is deteriorated. On the other hand, if the irradiation time becomes excessively long, then an effect for sputtering the surface of the silicon substrate by using the plasma becomes dominant, then the in-plane uniformity is deteriorated. While a proper plasma irradiation time present in an intermediate time between the long plasma irradiation time and the short plasma irradiation time is found out, during which the in-plane uniformity becomes better, a plasma doping process is carried out within the intermediate time.

15 Claims, 5 Drawing Sheets

PLASMA DOPING METHOD AND APPARATUS EMPLOYED IN THE SAME

RELATED APPLICATIONS

This application is the U.S. National Phase under 35 U.S.C. §371 of International Application No. PCT/JP2006/306290, filed on Mar. 28, 2006, which in turn claims the benefit of Japanese Application No. 2005-092543, filed on Mar. 28, 2005, the disclosures of which Applications are hereby incorporated herein.

TECHNICAL FIELD

The present invention is related to a plasma doping method and a plasma doping apparatus employed in the above-described plasma doping method. More specifically, the present invention is directed to a method for changing a characteristic of a surface, or for conducting an impurity in the surface by employing plasma in a manufacturing process of a semiconductor, and the like.

BACKGROUND ART

As technical ideas for irradiating plasma onto surfaces of samples corresponding to crystal so as to quality-change the irradiated sample surface into amorphous states, a plasma doping method using plasma of helium has been disclosed (refer to non-patent publication 1). FIG. 8 indicates a schematic structure of a typical plasma processing apparatus that is employed in conventional plasma doping operation. In FIG. 8, a sample electrode 6 for mounting thereon sample 9 made of a silicon substrate has been provided within a vacuum chamber 1. While a gas supplying apparatus 2 for supplying original gas containing a desirable element (for example, helium gas) into an interior portion of the vacuum chamber 1, and a pump 3 for depressurizing the interior portion of the vacuum chamber 1 have been provided, the pressure within the vacuum chamber 1 can be maintained in predetermined pressure.

Microwaves are radiated into the vacuum chamber 1 by a microwave waveguide 51 via a quartz plate 52 functioning as a dielectric window. Due to mutual effects between the microwaves and a DC magnetic field produced from an electromagnet 53, magnetic field microwave plasma (electron cyclotron resonance plasma) 54 is produced within the vacuum chamber 1. A high frequency power supply 10 is connected via a capacitor 55 to the sample electrode 6 in order that a potential of the sample electrode 6 can be controlled. It should be noted that gas supplied from the gas supplying apparatus 2 is conducted from a gas conducting port 56 into the vacuum chamber 1, and then, the conducted gas is exhausted from an exhausting port 11 to the pump 3.

In the plasma processing apparatus having the above-described structure, the original gas, for instance, helium gas conducted from the gas conducting port 56 is changed into plasma by such a plasma generating means which is constituted by the microwave waveguide 51 and the electromagnet 53, and helium ions contained in the plasma 54 are conducted to the surface of the sample 9 by the high frequency power supply 10.

A desirable impurity such as boron is conducted to the surface of the sample 9 that has been treated as the amorphous state thereof in the above-explained manner by an ion implanting unit, or a plasma doping unit so as to perform an activating process (will be discussed later). Furthermore, after a metal wiring layer has been formed on the sample 9 into which the impurity had been conducted, a thin oxide film is formed on the metal wiring layer in a predetermined oxidation atmosphere, and thereafter, when a gate electrode is formed on the sample 9 by a CVD apparatus, or the like, for example, an MOS transistor is obtained. It should be understood that. in order to fabricate a transistor, impurity ions are conducted by a plasma doping process, and thereafter, an activating process must be performed. An activating process implies such a process that a layer into which an impurity has been conducted is heated so as to be re-crystallized by employing such a method as RTA (rapid heating anneal), Spike RTA (spike rapid heating anneal), a laser anneal, a flash lamp anneal, or the like.

At this time, a very thin layer into which the impurity has been conducted is effectively heated, so that a shallow activated layer can be obtained. In order to effectively heat the very thin layer into which the impurity has been conducted, before the impurity is conducted, such a process operation is carried out by which an absorptance in the very thin layer into which the impurity will be conducted is increased with respect to light irradiated from a light source such as a laser and a lamp. This process operation is called as a pre-amorphyzation process operation. The above-described pre-amorphyzation process operation has already been proposed by the Inventors of the present invention (non-patent publication 1). That is, in accordance with this pre-amorphyzation process operation, in a plasma processing apparatus having a similar structure to that of the previously explained plasma processing apparatus, plasma such as the above-described He gas is generated; the generated ions such as He ions are accelerated by a bias voltage and the accelerated ions are caused to collide with the substrate; and then, the crystal structure of the substrate surface is destroyed so as to be brought into the amorphous state thereof.

Also, when boron is implanted into silicon crystal by ion implantation, boron is deeply implanted due to the channeling effect. This channeling effect implies such an effect that boron is implanted along particle boundaries of the tunnel-shaped crystal into deep portions without colliding with silicon atoms. Also, in such a case that this channeling effect is reduced and boron is wanted to be implanted into a shallow portion, the pre-amorphyzation processing operation is employed. That is to say, prior to the implantation of boron, since the crystal of silicon is brought into the amorphous state, the arrangement of the silicon atoms is fluctuated. As a result, the boron atoms may collide with the silicon atoms at random, so that the boron atoms can be implanted into the shallow portion.

Furthermore, the conduction of the impurity ions and the pre-amorphyzation processing operation can be carried out at the same time. At this time, a plasma processing apparatus having a similar structure to that of the previously explained plasma processing apparatus is employed. That is, such a plasma as gas mixed with a very small amount of $B_2H_6$ gas is generated in the above-described He gas; the generated ions such as He ions are accelerated by a bias voltage and the accelerated ions are caused to collide with the substrate; and then, the crystal structure of the substrate surface is destroyed so as to be brought into the amorphous state thereof. At the same time, ions such as B are accelerated by a bias voltage toward the substrate, and then, the accelerated ions are implanted into the substrate (non-patent publication 2).

Non-patent Publication 1: Y. Sasaki et al., "B2H6 Plasma Doping with In-situ He Pre-amorphyzation", 2004 Symposia on VLSI Technology and Circuits Non-patent Publication 2: R. Higaki et al., "Effects of gas phase absorption into Si substrates on plasma doping process", 2003 European Solid State Device Research Conf. (ESSDERC2003), (2003) 231.

DISCLOSURE OF THE INVENTION

Problems That the Invention Is To Solve

However, in the conventional system, there is such a problem that the in-plane uniformity of the amorphous layer is deteriorated. Due to the plasma process, the distribution fluctuation of the plasma is reflected on the silicon substrate having either the diameter of 200 mm or the diameter of 300 mm. As a result, there is another problem that the amorphous layer is not uniformly formed within the substrate plane.

This problem constitutes a new problem that newly occurs when a substrate surface is treated in the amorphyzation process by the plasma irradiation. This problem never occurs in such a technical idea that, for instance, germanium ions, or silicon ions are implanted into a surface of a silicon substrate. This reason is given as follows: That is, in an ion implantation, while an ion beam is employed whose sectional area is smaller than a sectional area of a silicon substrate, such a method for scanning the ion beam over the silicon substrate is employed, so that fluctuations of the ion beams within the ion beam sectional area can be averaged. At the same time, fluctuations in ion beam current amounts due to the aging effect can also be averaged within the silicon substrate plane by the same method. An amorphous layer may be determined based upon an ion seed, acceleration energy, and a dose amount. Since these items are uniformly averaged in a very high degree with the. silicon substrate plane, the following fact is known: That is, the amorphous layer can be easily formed in a superior in-plane uniformity.

On the other hand, in a plasma doping process, it is practical difficult to scan plasma, so that a uniformity of the plasma itself can be hardly realized.

The present invention has been made to solve the above-described problems, and therefore, has an object to provide a plasma doping method and a plasma doping apparatus, which have a superior in-plane uniformity of an amorphous layer formed on a sample surface.

Means For Solving the Problems

As a consequence, a plasma doping method, according to the present invention, is featured by such a plasma doping method comprising a step for contacting plasma to a sample within a vacuum chamber and for causing ions contained in the plasma to collide with a surface of the sample so as to quality-change the surface of the sample into an amorphous state thereof; in which while an irradiation time of the plasma is set to become such a time that a standard deviation of a depth of an amorphous layer within the sample becomes smaller than a standard deviation of ion density within the plasma at the surface of the sample, and further, the depth thereof becomes larger than, or equal to 90% of a depth where the amorphous layer is saturated, the plasma doping method is carried out.

Based upon results of various experiments, the Inventors of the present invention could find out such a fact that in a plasma doping method by which impurity ions contained in plasma are caused to collide with a surface of a sample so as to quality-change the surface of the sample into an amorphous surface, a proper plasma irradiation time is present by which an in-plane uniformity may be improved. The present invention has been made by paying an attention to this fact. In other words, if a plasma irradiation time becomes excessively short, then a fluctuation of plasma is transferred to a depth of an amorphous layer on a silicon substrate, so that an in-plane uniformity is deteriorated. On the other hand, if a plasma irradiation time becomes excessively long, then an effect for sputtering the surface of the silicon substrate by the plasma becomes dominant, so that the in-plane uniformity is deteriorated. The Inventors could find out such a fact that a proper plasma irradiation time capable of improving the in-plane uniformity is present in an intermediate time between the above-described irradiation times.

In the normal plasma doping, a distribution of ion density contained in plasma is transferred to a distribution of depths of an amorphous layer. In the beginning stage at which irradiation of plasma is commenced, a depth of an amorphous layer at a portion whose ion density is low becomes shallow, whereas a depth of an amorphous layer at a portion whose ion density is high becomes deep. However, if the plasma irradiation is continuously carried out, then the depth of the amorphous layer in the portion whose ion density is high starts to be saturated in an earlier stage, and thereafter, can hardly become deeper than a certain depth. On the other hand, in the portion whose ion density is low, the depth of the amorphous layer is continuously made deeper under better condition. Thereafter, if the plasma irradiation is continued, then the depth of the amorphous layer is gradually approximated to a saturated depth even in such a portion whose ion density is low, and then, can hardly become deeper.

At this stage, a change in the depths of the amorphous layer in the portion whose ion density is low is increased with respect to the time. As a result, the depth of the amorphous layer in the portion whose ion density is low may reach the depth as to the portion whose ion density is high, so that a difference between these depths of the amorphous layers becomes small.

It is obvious that a better result may be obtained from this mechanism, and the peripheral data when the depth of the amorphous layer is approximated to the saturation.

Also, a plasma doping method of the present invention is featured by that the plasma doping method is further comprised of: a step for measuring a relationship between the irradiation time of the plasma and a depth of a produced amorphous layer with respect to a predetermined number of the samples; and in which such an irradiation time that depths of the amorphous layers are uniform within the samples is defined as a plasma process time.

Also, a plasma doping method of the present invention is featured by that the measuring step corresponds to a method for measuring the depths of the amorphous layers by the ellipsometry; and such a plasma irradiation time that a standard deviation "σ" of the depths becomes smaller than, or equal to 1.3% is set as the plasma irradiation time.

Also, a plasma doping method of the present invention covers that the plasma irradiation time is set from 20 seconds to 60 seconds.

With employment of this structure, a depth of a uniform amorphous layer can be obtained.

Also, a plasma doping method of the present invention covers that the plasma irradiation time is set from 30 seconds to 50 seconds.

With employment of this structure, a depth of a uniform amorphous layer can be obtained.

Also, a plasma doping method of the present invention covers that the quality-changing step corresponds to such a step that impurity ion plasma is irradiated, and both an amorphyzation process and an implantation of the impurity ions are carried out at the same time.

Also, a plasma doping method of the present invention covers that the plasma doping method is further comprised of: a step for doping an impurity after the quality-changing step.

Also, a plasma doping method of the present invention is featured by that the measuring step is comprised of: a step for irradiating light on a surface of a dummy sample which has been treated by a plasma doping process so as to detect a difference between a polarization condition of incident light and a polarization condition of reflection light, and for calculating a depth of an amorphous layer of the dummy sample surface based upon the detected difference; and a step for controlling a process time of the quality-changing step in such a manner that a standard deviation of a fluctuation of the calculated depths of the amorphous layer becomes a predetermined value.

Also, a plasma doping method of the present invention covers that the sample is a semiconductor substrate made of silicon.

Also, a plasma doping method of the present invention covers that the plasma to be generated in the vacuum chamber is plasma of rare gas.

Also, a plasma doping method of the present invention covers that the plasma to be generated in the vacuum chamber contains helium plasma.

With employment of this structure, since an atomic radius of helium is the smallest atomic radius among the rare gas, the atoms are implanted into a deep portion of the silicon substrate by a low acceleration voltage. As a result, a power supply of a plasma irradiating apparatus can be made small, and therefore, this is preferable, since a deeper amorphous layer can be formed by a more compact apparatus.

Also, a plasma doping method of the present invention covers that the plasma to be generated in the vacuum chamber contains neon plasma.

With employment of this structure, in accordance with the present invention, an atomic radius of neon is the second smallest radius subsequent to that of helium, and an apparatus may be similarly made compact.

Also, a plasma doping method of the present invention covers that the plasma to be generated in the vacuum chamber is plasma containing boron; quality-changes a surface of a sample corresponding to crystal into an amorphous state thereof; and at the same time, is used to perform a plasma doping process for conducting boron into the sample surface.

Also, a plasma doping method of the present invention covers that the plasma to be generated in the vacuum chamber is plasma containing diborane.

Also, a plasma doping method of the present invention covers that the plasma to be generated in the vacuum chamber is plasma containing arsenic, phosphorus, or antimony; quality-changes a surface of a sample corresponding to crystal into an amorphous state thereof; and at the same time, is used to perform a plasma doping process for conducting arsenic, phosphorus, or antimony into the sample surface.

Also, a plasma doping method of the present invention covers that the dummy sample is a portion of a sample that is provided in a portion which becomes unnecessary as a device of the sample.

Further, a plasma doping method, according to the present invention, is featured by such a plasma doping method comprising a step for contacting plasma to a sample within a vacuum chamber and for causing ions contained in the plasma to collide with a surface of the sample so as to quality-change the surface of the sample into an amorphous state thereof; in which an irradiation time of plasma is set to be long at such a degree that a depth of an amorphous layer of a portion where density of ions contained in the plasma on a substrate plane is low reaches in the vicinity of a maximum value.

With employment of this structure, in the portion where the ion density contained in the plasma on the sample surface is high, the depth of the amorphous layer reaches the maximum value in a short time, whereas in the portion where the ion density contained in the plasma on the sample surface is low, the depth of the amorphous layer reaches the maximum value in a long time. The irradiation time of the plasma is set to be long at such a degree that the depth of the amorphous layer of the portion whose the ion density is low reaches in the vicinity of the maximum value. As a result, a difference between the depth of the amorphous layer of the portion whose the ion density is low, and the depth of the amorphous layer of the portion whose the ion density is high is decreased, so that the depths of the amorphous layers on the sample surface can be made uniformly.

Also, a plasma doping method of the present invention covers that while an irradiation time of the plasma is set to become such a time during which the depth of the amorphous layer of the portion whose ion density is low becomes such a depth larger than, or equal to 90% of the maximum value when the irradiation time of the plasma is changed, the plasma doping method is carried out.

With employment of this structure, the uniformity within the substrate plane can be realized.

Also, an apparatus used to perform the plasma doping method of the present invention is comprised of: a plasma doping chamber equipped with a vacuum chamber, a sample electrode, gas supplying means for supplying gas into the vacuum chamber, exhausting means for exhausting gas within the vacuum chamber, pressure control means for controlling pressure within the vacuum chamber, plasma supplying means for supplying plasma to said sample, and a sample electrode-purpose power supply for supplying electric power to the sample electrode; a light irradiating unit for irradiating light to the sample; and a sensing unit for sensing a polarization condition of light entered into the sample, and a polarization condition of light reflected from the sample.

Also, a plasma doping apparatus of the present invention covers that the sensing unit is arranged within the plasma doping chamber.

Also, a plasma doping apparatus of the present invention, covers that the sensing unit is arranged in an investigating chamber which is provided independently from the plasma doping chamber.

As previously described, in accordance with the present invention, in the plasma doping method by which the impurity ions contained in the plasma are caused to collide with the surface of the sample so as to quality-change the surface of the sample into the amorphous state thereof, it is possible to find out such a fact that the proper plasma irradiation time capable of improving the in-plane uniformity is present, and the in-plane uniformity is controlled based upon the plasma irradiation time. As a result, the depth can be easily controlled.

BEST MODE FOR CARRYING OUT THE INVENTION

Referring now to drawings, a detailed description is made of embodiment modes of the present invention.

Embodiment Mode 1

A description is made of an embodiment mode 1 of the present invention with reference to FIG. 1 through FIG. 5.

A method of the present invention is featured by that a time is prolonged not to become such a degree that a fluctuation of plasma is transferred to a depth of an amorphous layer on a silicon substrate and thus an in-plane uniformity is deteriorated; and on the other hand, a plasma irradiation time is carried out in order to maintain such a degree that an effect for sputtering a surface of the silicon substrate by employing plasma becomes a dominant position and thus the in-plane uniformity is not deteriorated; and a bias power condition is adjusted based upon this plasma irradiation time so as to perform a plasma doping process of a desirable depth.

Figure 1:
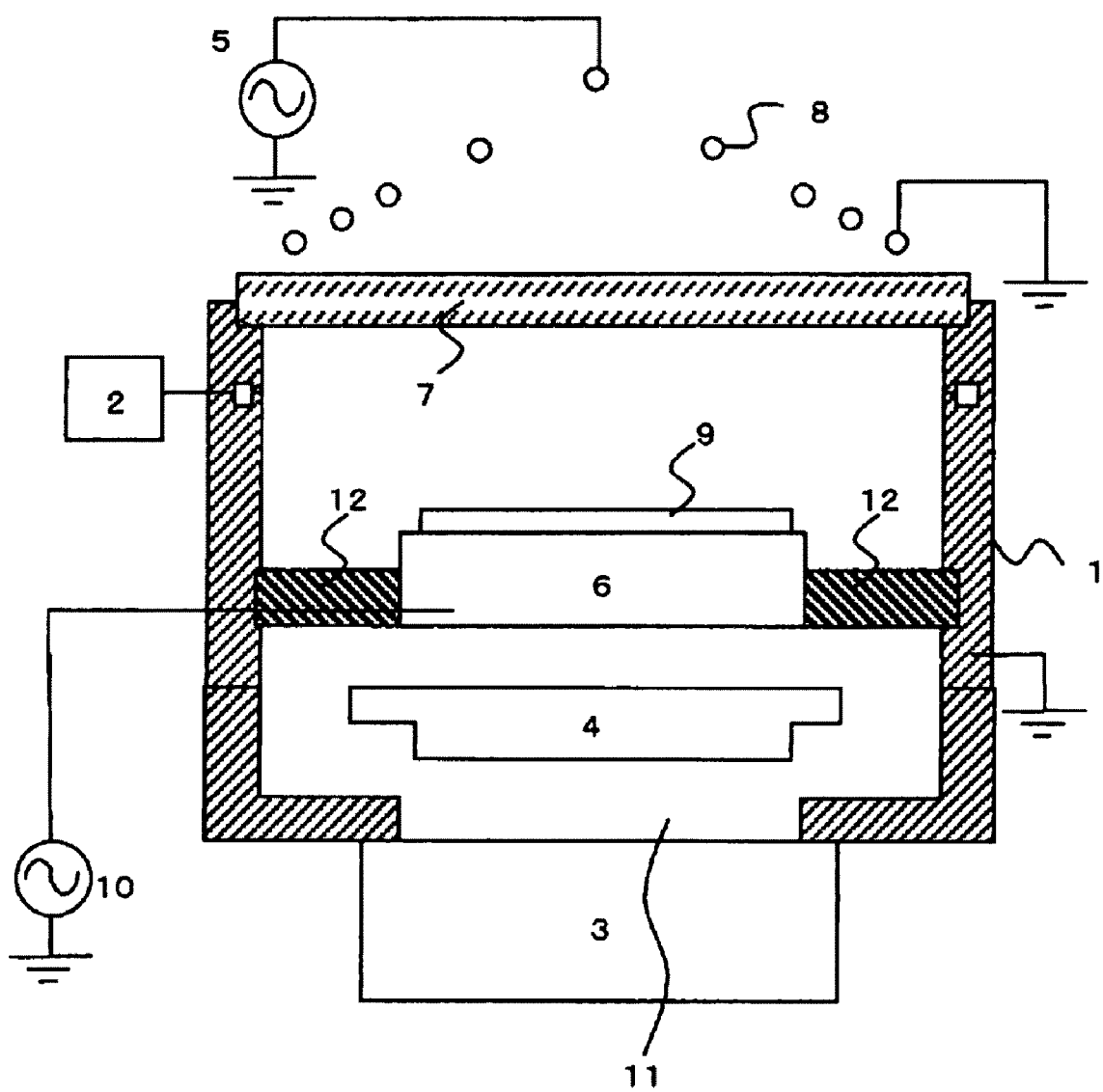
FIG. 1 is a sectional view for indicating a structure of a plasma doping chamber employed in an embodiment mode 1 of the present invention.

FIG. 1 indicates a sectional view of a plasma irradiating chamber of a plasma doping apparatus employed in the embodiment mode 1 of the present invention. In FIG. 1, while predetermined gas is conducted from a gas supplying apparatus 2 into a vacuum chamber 1, gas is exhausted by a turbo molecular pump 3 functioning as an exhausting apparatus, and interior pressure of the vacuum chamber 1 can be kept at predetermined pressure by a pressure control valve 4. Since high frequency power of 13.56 MHz is supplied to a coil 8 provided in the vicinity of a dielectric window 7 located opposite to a sample electrode 6, induction coupling type plasma can be generated within the vacuum chamber 1. A silicon substrate 9 as a sample is mounted on the sample electrode 6. Also, while a high frequency power supply 10 is provided which supplies high frequency power to the sample electrode 6, this high frequency power supply 10 functions as a voltage source for controlling a potential of the sample electrode 6 in such a manner that the substrate 9 functioning as the sample has a negative potential with respect to the plasma. The high frequency power supply 10 can accelerate ions contained in the plasma toward a surface of the sample and can cause the accelerated ions to collide with the surface of the sample so as to bring the surface of the sample into an amorphous state thereof, and can conduct an impurity into the surface of the sample in the above-described manner. It should be noted that gas supplied from the gas supplying apparatus 2 is exhausted from an exhaust port 11 to the pump 3. Both the turbo molecular pump 3 and the exhaust port 11 have been arranged just under the sample electrode 6, and also the pressure control valve 4 corresponds to an elevation valve which is located just under the sample electrode 6 and further just above the turbo molecular pump 3. The sample electrode 6 has been fixed to the vacuum chamber 1 by employing 4 pieces of pillars 12.

After the substrate 9 has been mounted on the sample electrode 6, while a temperature of the sample electrode 6 is maintained at 25° C. and the interior of the vacuum chamber 1 is exhausted from the exhaust port 11, helium gas is supplied by 50 sccm to the interior of the vacuum chamber 1 by the gas supplying apparatus 2, and the pressure control valve 4 is controlled so as to keep pressure inside the vacuum chamber 1 at 1 Pa. Next, since high frequency power (source power of 1500 W and 900 W in this example) is supplied to the coil 8 as the plasma source, plasma is generated within the vacuum chamber 1, and since high frequency power (bias power BP of 50 to 300 W in this example) is supplied to a base 16 of the sample electrode 6, a crystal layer of the surface of the silicon substrate 9 is brought into an amorphous state thereof.

Figure 2:
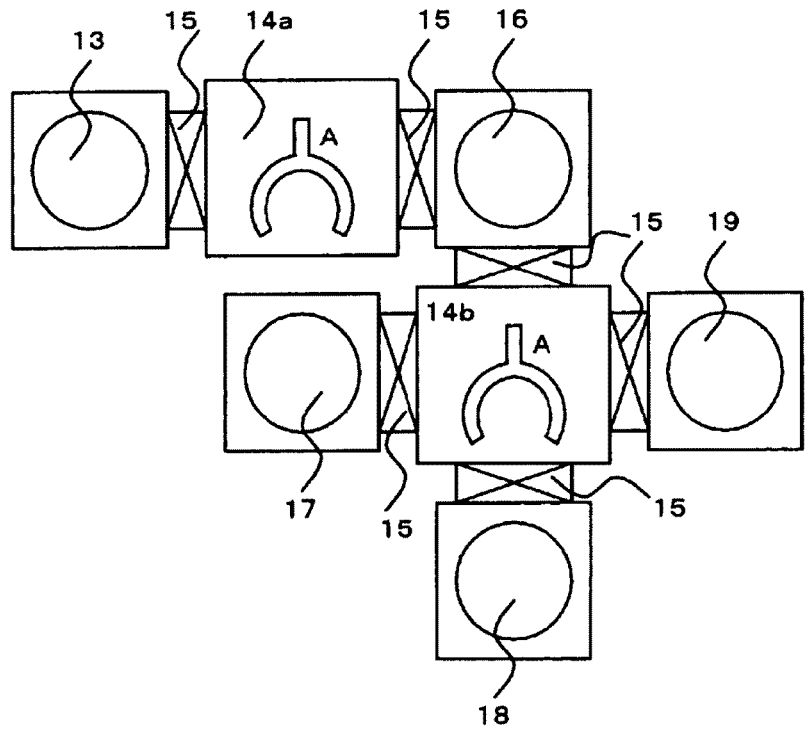
FIG. 2 is a plan view for showing an entire structure of a plasma doping apparatus according to the embodiment mode 1 of the present invention.

FIG. 2 is a plan view for indicating an entire structure of the plasma doping apparatus. In FIG. 2, after a sample is mounted inside a loader chamber 13, the loader chamber 13 is exhausted so as to be brought into a vacuum condition. A gate 15 is opened which is provided between a first transfer chamber 14a and the loader chamber 13, and a transport arm A with the first transfer chamber 14 is manipulated so as to transfer the sample into the first transfer chamber 14. Next, similarly, the gate 15 is opened and closed in a proper manner, and the transport arm A is manipulated so as to transport the sample to a plasma irradiation chamber 16, and as previously descried, an amorphyzation process is carried out. Next, the sample is transported from the plasma irradiation chamber 16 to a second transfer chamber 14b, and furthermore, the sample is transported to an unloader chamber 19 so as to derive therefrom the sample.

In the embodiment mode 1, in order to correctly control a characteristic of an amorphous layer, a depth of the amorphous layer was monitored by employing a dummy sample. As a cause why the depth is changed under the same process condition, there are various reasons, namely, a deposition of a matter deposited on an inner wall of a vacuum chamber; a temperature change of the inner wall of the vacuum chamber; a characteristic change of a high frequency power supply; and the like. Thus, the actual cause cannot be easily specified. Now, in this case, the dummy sample was conducted every time 25 sheets of samples were processed. As the dummy sample, a monocrystalline silicon substrate having the substantially same size as that of a sample for forming a device was employed. A patterning process such as a resist was not performed with respect to the dummy sample, but an amorphyzation process was carried out with respect to the entire surface of the sample.

Firstly, in FIG. 2, after the dummy sample is mounted inside the loader chamber 13, the loader chamber 13 is exhausted so as to be brought into a vacuum condition. The gate 15 is opened which is provided between the first transfer chamber 14a and the loader chamber 13, and the transport arm A within the first transfer chamber 14 is manipulated so as to transfer the dummy sample into the first transfer chamber 14. Next, similarly, the gate 15 is opened and closed in a proper manner, and the transport arm A is manipulated so as to transport the dummy sample to the plasma irradiation chamber 16, and an amorphyzation process is carried out under such a condition just before the sample was processed. Next, the dummy sample is transported from the plasma irradiation chamber 16 to the second transfer chamber 14b, and furthermore, the dummy sample is transported to an investigation chamber 17. The dummy sample where a depth of an amorphous layer and the like have been measured in the investigation chamber is again transported to the second transfer chamber 14b. Furthermore, the dummy sample is transported to the unloader chamber 19 and then is derived therefrom.

In order that a depth of an amorphous layer can obtain a desirable value with a superior repetition characteristic, every time 25 sheets of the samples were processed, the dummy sample was treated by the plasma doping process; and sample processing conditions and processing times were controlled in such a manner that the depths of the amorphous layers of the dummy sample processed by the plasma irradiation process become a predetermined value, and a fluctuation of the depths thereof is smaller than, or equal to a predetermined value. Concretely speaking, firstly bias power is changed so as to measure a relationship between the bias power and the depth, and then, the bias power is determined. Thereafter, a processing time is changed under this bias power, and then, such a processing time is determined in such a manner that the fluctuation in the depths of the amorphous layer of the dummy sample become smaller than, or equal to the predetermined value.

In order to grasp how to change bias power BP which is supplied to a sample electrode, high frequency power SP which is supplied to a plasma source, or a processing time, the following examination may be merely carried out, namely, how degree a depth of an amorphous layer is changed in such a case that these respective control parameters are changed under the standard amorphous processing condition. In order to change these control parameters, such a software capable of automatically rewriting a process recipe stored in a control system of an apparatus (not shown) may be constructed.

A plasma doping method having a superior control characteristic as to a depth of an amorphous layer formed on a sample surface can be realized with employment of the above-described arrangement.

Embodiment 1

Depth Control of Amorphous Layer By Bias

Figure 3:
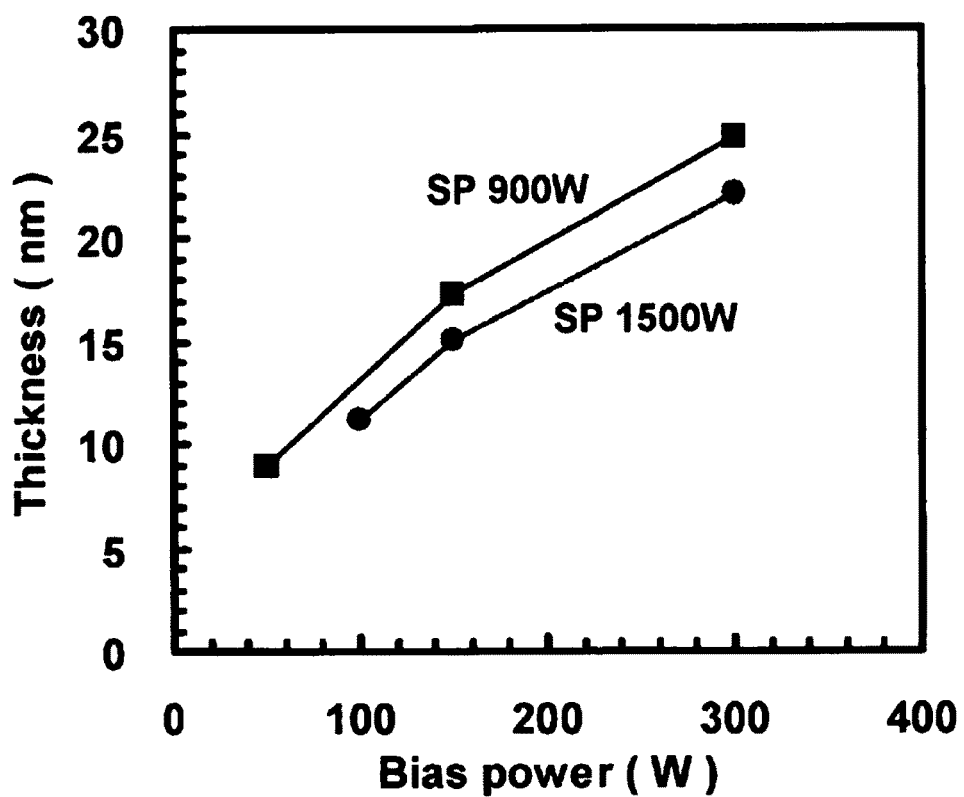
FIG. 3 is a diagram for representing a relationship between bias electric power and a depth of an amorphous layer in the embodiment mode 1 of the present invention.

Firstly, in the above-described apparatus, a relationship between bias power and a depth of an amorphous layer was measured. A result of this measurement is represented in FIG. 3. As a substrate, a p type substrate having a diameter of 200 mm was employed. The process operation was carried out under such a condition that pressure was 0.9 Pa, and a time 5 for applying a bias was 20 seconds. The high frequency power SP was investigated by changing the SP under two levels of 1500 W and 900 W. Then, while the bias power was changed within a range from 50 W to 300 W, a change in depths of amorphous layers was investigated. In this case, the depth is indicated by such an averaged valve that 3 points of a center portion within the wafer plane were measured by an elipsometer.

It should also be noted that even in a plasma doping apparatus A corresponding to another process chamber, it could be confirmed that the depth of the amorphous layer could be controlled by changing a bias. For the sake of easy experiments, since only 3 levels of biases have been merely acquired, the depth of the amorphous layer cannot be expressed based upon a correct approximate expression at this stage. However, the following fact can be revealed. That is, even based upon experimental results obtained by a plasma doping apparatus manufactured by CVR company, and a plasma doping apparatus B, the thickness of the amorphous layer has a better direct proportional relationship with respect to the biases.

As a consequence, assuming now that the thickness of the amorphous has the direct proportional relationship with the bias even in the plasma doping apparatus A, when the SP is 900 W, a relationship between the depth and the bias can be expressed by a formula 1. Also, when the SP is 1500 W, a relationship between the depth and the bias can be expressed by a formula 2. It should be noted that symbol "T" indicates a depth (nm), and symbol "W" shows BP (W).

$$T=0.0623 \cdot W+6.6632 \quad \text{(formula 1)}$$

$$T=0.0529 \cdot W+6.3999 \quad \text{(formula 2)}$$

As a result, the below-mentioned facts can be revealed. If the bias power is changed by 2 W, then the depth is changed by approximately 0.1 nm. In other words, there are large possibilities that the depth can be controlled in the precision of 0.1 nm. Also, in accordance with the above-described formula 1 and formula 2, even if the bias power is not applied, or even when such a very low BP as 10 W is applied, an amorphous layer having a thickness of approximately 6 nm can be formed.

As a consequence, in the case that an amorphous layer having a shallow thickness of approximately 6 nm is wanted to be manufactured in a superior control characteristic, there are some possibilities that good ideas must be taken, for example, Ne is mixed. On the other hand, as shown in FIG. 3, amorphous layers having thicknesses larger than, or equal to 8 nm, and smaller than, or equal to 25 nm may be formed only by He.

Figure 4:
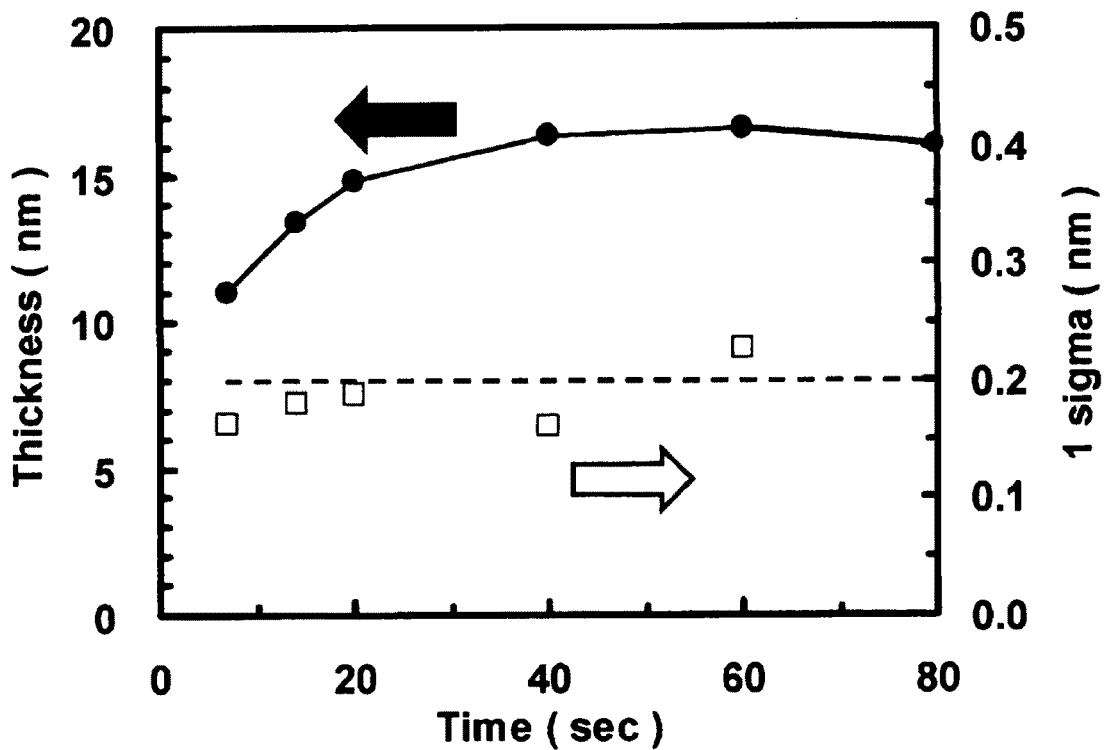
FIG. 4 is a diagram for showing a relationship between a bias applying time and a depth of an amorphous layer in the embodiment mode 1 of the present invention.

Relationship@200 mm Among Processing Time, Depth of Amorphous Layer And In-Plane Uniformity Next, a measurement was made of a relationship between a processing time and a depth of an amorphous layer with employment of the plasma doping apparatus A. A result of this measurement is shown in FIG. 4. In FIG. 4, an abscissa indicates a bias applying time, and an ordinate shows a depth of an amorphous layer. Also, in this case, a p type substrate having a diameter of 200 mm was employed. The plasma doping process was carried out under such a condition that pressure was 0.9 Pa, SP was 1500 W, and BP was 150 W. Then, while the time for applying the bias was changed within a range from 7 seconds to 60 seconds, a change in depths of an amorphous layer was measured. Also, a standard deviation of the depths was also measured in order to measure a change in the in-plane uniformities. In this case, the depth of the amorphous layer was defined as an averaged value calculated by measuring 81 points within the wafer plane by employing an ellipsometer, and the standard deviation of the depths was evaluated at 81 points except for an edge portion of 5 mm as to the substrate.

As a result, the following fact can be revealed: That is, the depth of the amorphous layer is increased in connection with the increase of the bias applying time, and then, is saturated for approximately 40 seconds. In such a case that another measurement was carried out under another condition by employing the PD apparatus manufactured by CVR company, the depth of the amorphous layer was saturated for approximately 25 seconds. As a result, it can be understood that the times during which the depths are saturated are different from each other, depending upon conditions of plasma.

Also, referring now to FIG. 4, a depth of an amorphous layer is approximately 16.5 nm at 60 seconds, and thus, it can be grasped that the depth has been saturated at this time. At 80 seconds, a depth of an amorphous layer is approximately 16.1 nm, namely, precisely speaking, the depth of the amorphous layer is slightly decreased. Although it is conceivable that this phenomenon is caused by the sputtering effect, a detailed reason is unclear. On the other hand, assuming now that the depth of the amorphous layer when being saturated is 16.5 nm, 90% of this depth is 14.85 nm; while a margin from 14.85 nm is secured, when a depth of the amorphous layer becomes 15 nm, this time is equal to 20 seconds.

Figure 5:
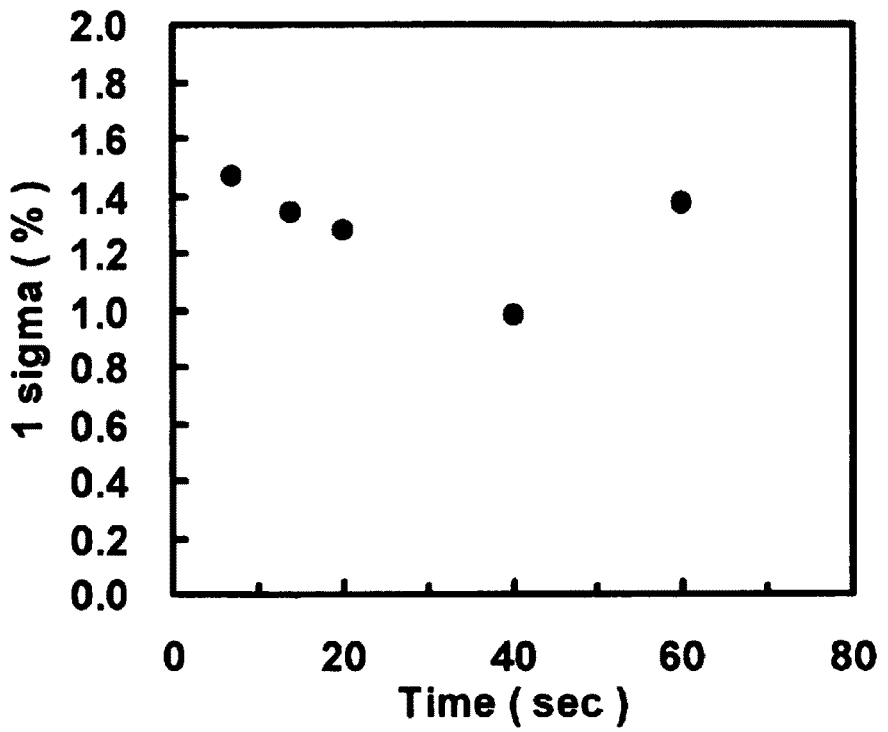
FIG. 5 is a diagram for showing a relationship between a bias applying time and an in-plane uniformity as to a depth of an amorphous layer in the embodiment mode 1 of the present invention.

In this case, referring now to FIG. 5, since the processing time was firmly selected to be longer than, or equal to 20 seconds, the uniformity smaller than or equal to 1.3% could be obtained. In other words, since the plasma irradiation time is set in such a manner that the depth of the amorphous layer becomes larger than, or equal to 90% of the maximum depth value, it can be revealed that a very good uniformity can be obtained.

In the present experiment with employment of the plasma doping apparatus A, the saturation time was around 60 seconds. However, there is a higher possibility that such a plasma condition is present under which the depth of the amorphous layer is saturated at a slightly shorter time than 60 seconds. As a consequence, while saturation times have been previously confirmed in experiments with respect to the respective apparatuses, these saturation times may be defined as process times.

The uniformity as to the thicknesses the amorphous layers was smaller than, or equal to 0.2 nm at 1σ until the bias applying time becomes 40 seconds. However, if the bias applying time was prolonged up to 60 seconds, then the uniformity become 0.23 nm at 1σ, namely the fluctuation is increased. FIG. 5 is a diagram for representing a relationship between the bias applying time and the in-plane uniformity. It can be understood from FIG. 5 that in order to keep the in-plane uniformity at a better level, an optimum bias applying time is present. Under the present condition, this optimum bias applying time is 40 seconds. At this time, the in-plane uniformity was 0.98% at 1σ.

The in-plane uniformity was evaluated based upon such a value calculated by dividing the standard deviation of the depths by the averaged value of the depths. At shown in FIG. 4, when the bias applying time is shorter than, or equal to 40 seconds, the standard deviation of the depths is present in such a range from 0.16 nm to 0.19 nm, namely, is not so largely changed. On the other hand, the averaged value of the depths is increased in connection with the bias applying time. However, if the bias applying time exceeds 40 seconds, then the standard deviation of the depth fluctuations is deteriorated, and on the other hand, the averaged value of the depths is not substantially increased. As a result, the in-plane uniformity is deteriorated.

Figure 6:
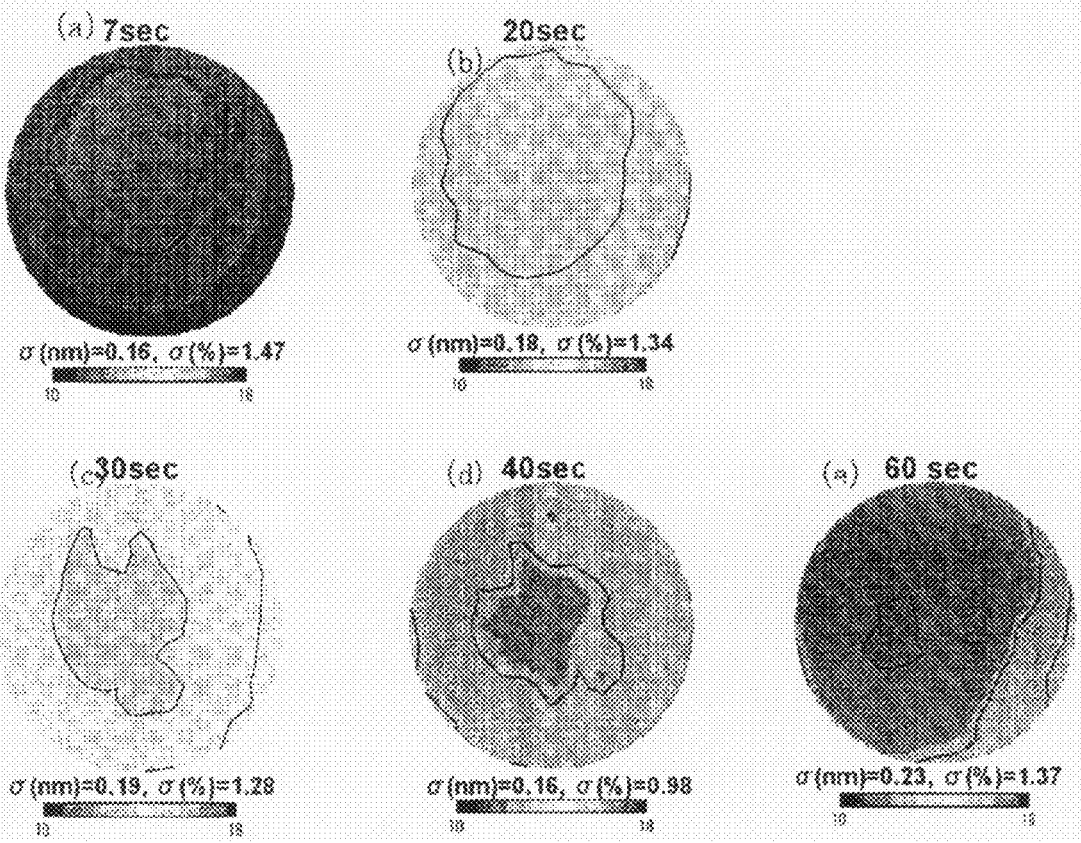
FIG. 6 is a diagram for representing an in-plane distribution of a depth of an amorphous layer when the bias applying time is changed in the embodiment mode 1 of the present invention.

Next, a cause why the standard deviation of the depth fluctuations is deteriorated when the bias applying time exceed 40 seconds will now be considered. FIG. 6 represents changes in in-plane distributions of depths of amorphous layers when the bias applying time is changed. Such a condition can be understood from this drawing that a depth of an amorphous layer which was shallow in the beginning over the entire wafer plane becomes deep. When the bias applying time is 60 seconds, such a feature can be recognized which could not be conspicuously seen when the bias applying time is shorter than, or equal to 40 seconds. In other words, this such a feature that the depth of the lower right side becomes shallow in the drawing. This direction corresponds to such a portion that the sputtering effect may easily occur, as compared with other portions within the substrate plane in view of the structure of the apparatus. When the bias applying time becomes 60 seconds which exceeds the saturation, the feature of such a portion that the sputtering effect may easily occur can be readily developed.

Embodiment Mode 2

Next, a measurement is made as to a relationship between a fluctuation in ion density of plasma and a fluctuation in depths of an amorphous layer within a substrate.

While an apparatus similar to the apparatus shown in FIG. 1 was employed, boron was conducted (implanted) into silicon by employing mixture gas made of $B_2H_6$ and He. A gas mixture ratio of $B_2H_6$ to He is selected to be 0.05% and 99.95%. Pressure was 0.9 Pa, and source power was 1500 W. As the silicon substrate, an n type substrate having a diameter of 300 mm was employed. At this time, in such a process operation that the surface of the silicon substrate is treated in an amorphyzation process, ion density of the used $B_2H_6$/He plasma was measured. A standard deviation of this ion density was 9.63 % at 1σ. When the ion density was measured, a Langmuir probe was used. This ion density measurement is carried out as follows: That is, when a needle made of tungsten is entered into plasma, and then, a plus voltage and a minus voltage are applied to the needle in a periodic manner, amounts of electrons and ions contained in this plasma jump into the needle are measured, so that ion density within the plasma is measured.

On the other hand, standard deviations of the depths of the amorphous layers were 3.74% at 1σ in the case that the plasma irradiation time was 7 seconds; 2.87% at 1σ in the case that the plasma irradiation time was 14 seconds; and 1.24% at 1σ in the case that the plasma irradiation time was 60 seconds.

Also, depths of the amorphous layers obtained at this time were 6.37 nm in the case that the plasma irradiation time was 7 seconds; 7.96 nm in the case that the plasma irradiation time was 14 seconds; 9.90 nm in the case that the plasma irradiation time was 30 seconds; 10.70 nm in the case that the plasma irradiation time was 60 seconds; and 10.10 nm in the case that the plasma irradiation time was 80 seconds.

For instance, as to ion density of plasma, the ion density thereof is high at the center of the substrate, whereas the ion density thereof is low at the edge portion of the substrate. In contrast to the above-described ion density, as to depths of an amorphous layer, normally, the depth thereof was deep at the center of the substrate, whereas the depth thereof was shallow at the edge portion of the substrate. As previously explained, the depths of the amorphous layer constitute such a shape transferred from the shape of the ion density. However, it is possible to grasp that the uniformity of the fluctuation may be made more uniform by adjusting the plasma doping time.

Also, as to a method for adjusting time, the plasma doping time is adjusted in such a manner that the depth of the amorphous layer becomes such a depth (namely, 9.63 nm in this example) which is larger than or equal to 90% of the depth (namely 10.70 nm in this example) at which the amorphous layer is saturated. As a result, the superior uniformity can be obtained.

Embodiment Mode 3

Figure 7:
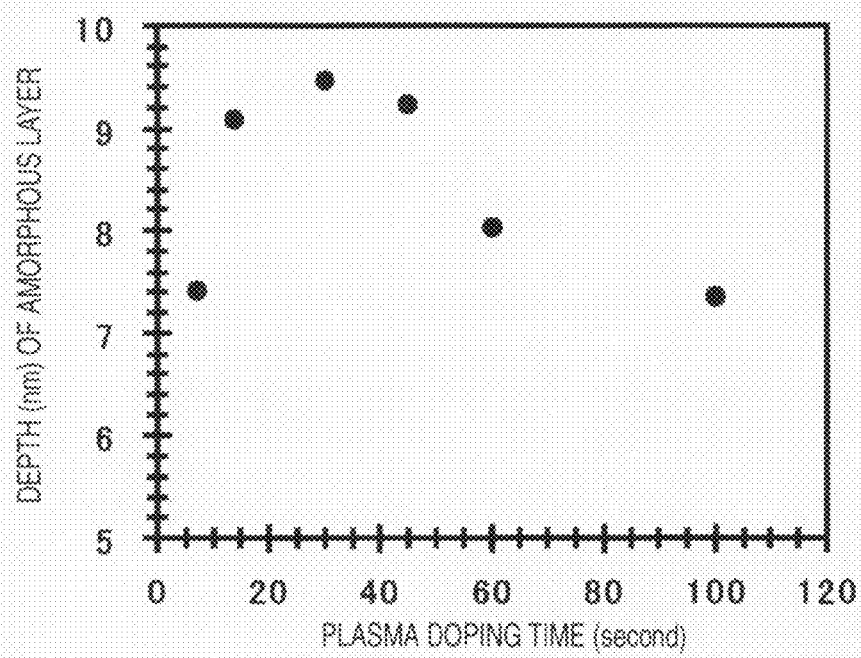
FIG. 7 is a diagram for showing a relationship between a bias applying time and an in-plane uniformity as to a depth of an amorphous layer in an embodiment mode 3 of the present invention.
Figure 8:
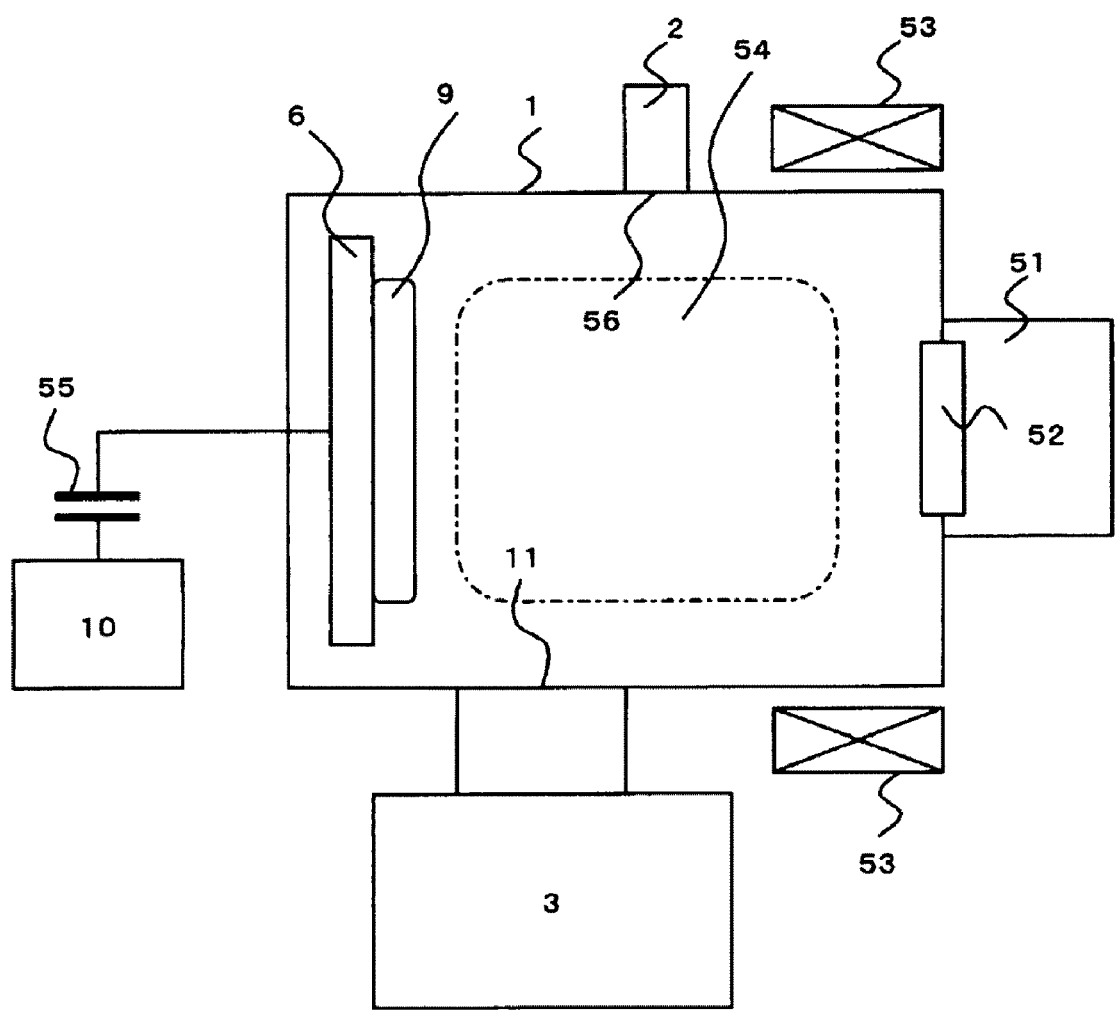
FIG. 8 is a sectional view for representing the structure of the plasma doping apparatus employed in the conventional technique.

A measurement was made of a relationship between a process time and a depth of an amorphous layer with employment of the plasma doping apparatus manufactured by CVR company. A result of this measurement is shown in FIG. 7. In FIG. 7, an abscissa indicates a bias applying time, and an ordinate shows a depth of an amorphous layer. Also, in this case, a p type substrate having a diameter of 200 mm was employed. The plasma doping process was carried out under such a condition that pressure was 0.9 Pa, SP was 1500 W, and BP was 60 W. Then, while the time for applying the bias was changed within a range from 7 seconds to 100 seconds, a change in depths of an amorphous layer was measured. In the plasma doping apparatus manufactured by CVR company, it is possible to grasp that the depth of the amorphous layer is once saturated (namely, has maximum value) near 30 seconds, and thereafter, this depth becomes shallow. It is possible to recognize such a trend that the depth of the amorphous layer finally becomes constant. As previously explained, there are two stages in the saturations. That is, there are a time when the depth of the amorphous layer has the maximum value at a first time, and another time when the depth thereof finally becomes constant with respect to the time change.

The implication "depth of amorphous layer is saturated" described in the embodiment mode 1 and the embodiment mode 2 has described such a time when the depth of the amorphous layer becomes maximum at first in FIG. 7. In this example, this time implies approximately 30 seconds. There is such a trend that the depth of the amorphous layer becomes constant later. When there is no problem about shaving of silicon by a sputtering process, the amorphous layer can be used even in the time during which the depth of the amorphous layer finally becomes constant with respect to the temporal change to be saturated. However, in an actual case, there are substantially all cases when saving of silicon by the sputtering process may cause the problem. If the saturation time when the depth of the amorphous layer firstly has the maximum value is used, then the better in-plane uniformity may be obtained. As a consequence, it is desirable to use the saturation time when the depth of the amorphous layer firstly has the maximum value.

In this embodiment mode 3, the description has been made of only such an example that the plasma doping apparatus manufactured by CVR company was employed. However, even when other apparatuses such as the plasma doping apparatuses A and B are employed, similar effects may be achieved with more or less differences.

More specifically, there are particular advantages in a silicon substrate having a diameter larger than, or equal to 200 mm, preferably 300 mm, which has an amorphous layer, while this amorphous layer has been uniformly formed by a plasma doping method in order that the uniformity becomes smaller than, or equal to 1.3%. This reason is well known. That is, if a substrate having a larger diameter is employed, then a total number of semiconductor chips is increased which can be manufactured within a single process operation, so that there is an economical merit. It should also be noted that when a resist pattern has been attached to this silicon substrate having the large diameter, the above-described uniformity is understood as a uniformity of an amorphous layer as to such a portion of the silicon substrate except for the substrate portion to which the resist has been attached, and which is exposed to the surface.

INDUSTRIAL APPLICABILITY

Since the plasma doping method and apparatus capable of having superior controlling characteristics as to either the implantation depth of the impurity conducted to the sample surface or the depth of the amorphous layer can be provided, the plasma doping method and the plasma doping apparatus, according to the present invention, can be applied to the impurity doping step of the semiconductor, the manufacture of the thin-film transistor employed in liquid crystal and the like, and also various utilizations, for example, surface qualities of various sorts of materials being changed.

The invention claimed is:

1. A plasma doping method comprising a step for contacting plasma to a sample within a vacuum chamber and for causing ions contained in the plasma to collide with a surface of the sample so as to quality-change the surface of the sample from a crystal state into an amorphous state thereof; comprising:
   a step (A) of determining a plasma doping time range; and
   a step (B) of quality-changing the surface of the sample from the crystal state into the amorphous state by using a predetermined plasma doping time range contained in the plasma doping time range, after the step (A);
   wherein the step (A) includes a step of respectively calculating an ion density at a plurality of portion within the surface of the sample;
   wherein the plasma, a standard deviation of density is equal to or smaller than 9.6%; and
   a time range, in which a depth of the amorphous layer formed on the surface of the sample that is corresponded to a portion whose ion density is smallest among the respective ion density is larger than or 90% of a depth of the maximum value that can be obtained while equal to or a shorter time than 60 seconds, and which is equal to or shorter time than 60 seconds, is determined as the predetermined plasma doping time range.

2. The plasma doping method as claimed in claim 1 wherein said plasma doping time range is set from 20 seconds to 60 seconds.

3. The plasma doping method as claimed in claim 1 wherein:
   the step (A) further includes a step of calculating a depth of the amorphous layer formed on the surface of the sample that is corresponded to a portion whose ion density is largest among the respective ion density; and
   a time range, in which a difference between the depth of the amorphous layer at the portion whose ion density is smallest among the respective ion density and the depth of the amorphous layer at the portion whose ion density is largest among the respective ion density is equal to, or smaller than 0.2 nm, is determined as the predetermined plasma doping time range.

4. The plasma doping method as claimed in claim 1 wherein:
   said step (B) is a step that impurity ion plasma is irradiated such both an amorphyzation process and an implantation of the impurity ions are carried out at the same time.

5. The plasma doping method as claimed in claim 1, further comprising a step of doping an impurity after the step (B).

6. The plasma doping method as claimed in claim 1, wherein said sample is a semiconductor substrate.

7. The plasma doping method as claimed in claim 1, wherein the plasma to be generated in the vacuum chamber is plasma of rare gas.

8. The plasma doping method as claimed in claim 7, wherein the plasma to be generated in the vacuum chamber is helium plasma.

9. The plasma doping method as claimed in claim 7 wherein the plasma to be generated in the vacuum chamber is neon plasma.

10. The plasma doping method as claimed in claim 1 wherein the plasma to be generated in the vacuum chamber is plasma containing boron; quality-changes a surface of a sample corresponding to crystal into an amorphous state thereof; and at the same time, is used to perform a plasma doping process for conducting boron into the sample surface.

11. The plasma doping method as claimed in claim 1 wherein the plasma to be generated in the vacuum chamber is plasma containing diborane.

12. The plasma doping method as claimed in claim 1 wherein the plasma to be generated in the vacuum chamber is plasma containing arsenic, phosphorus, or antimony; quality-changes a surface of a sample corresponding to crystal into an amorphous state thereof; and at the same time, is used to perform a plasma doping process for conducting arsenic, phosphorus, or antimony into the sample surface.

13. In an apparatus for performing the plasma doping method recited in claim 1,
a plasma doping apparatus comprising:
a plasma doping chamber equipped with a vacuum chamber, a sample electrode, gas supplying means for supplying gas into said vacuum chamber, exhausting means for exhausting gas within said vacuum chamber, pressure control means for controlling pressure within said vacuum chamber, plasma supplying means for supplying plasma to said sample, and a sample electrode-purpose power supply for supplying electric power to said sample electrode;
a light irradiating unit for irradiating light to said sample; and
a sensing unit for sensing a polarization condition of light entered into said sample, and a polarization condition of light reflected from said sample.

14. The plasma doping apparatus as claimed in claim 13 wherein said sensing unit is arranged within said plasma doping chamber.

15. The plasma doping apparatus as claimed in claim 14 wherein said sensing unit is arranged in an investigating chamber that is provided independently from said plasma doping chamber.

* * * * *